(12) United States Patent
Kim et al.

(10) Patent No.: US 8,345,487 B2
(45) Date of Patent: Jan. 1, 2013

(54) METHOD OF SETTING READ VOLTAGE MINIMIZING READ DATA ERRORS

(75) Inventors: Yong June Kim, Seoul (KR); Jae Hong Kim, Seoul (KR); Jun Jin Kong, Yongin-si (KR); Hong Rak Son, Anyang-si (KR); Seung-Hwan Song, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 323 days.

(21) Appl. No.: 12/774,814

(22) Filed: May 6, 2010

(65) Prior Publication Data

US 2010/0296350 A1 Nov. 25, 2010

(30) Foreign Application Priority Data

May 20, 2009 (KR) .................. 10-2009-0043825

(51) Int. Cl.
*G11C 11/413* (2006.01)

(52) U.S. Cl. ............ 365/185.2; 365/201; 365/189.15; 365/185.03; 365/185.18

(58) Field of Classification Search ............ 365/185.2, 365/185.18, 185.03, 189.15, 201
See application file for complete search history.

(56) References Cited

U.S. PATENT DOCUMENTS

| | | | |
|---|---|---|---|
| 8,023,323 B2* | 9/2011 | Kang et al. ............ | 365/185.03 |
| 2008/0094914 A1 | 4/2008 | Park et al. | |
| 2008/0192541 A1* | 8/2008 | Kang et al. ............ | 365/185.03 |
| 2009/0003057 A1* | 1/2009 | Kang et al. ............ | 365/185.03 |
| 2009/0003071 A1 | 1/2009 | Nishihara et al. | |
| 2009/0168543 A1* | 7/2009 | Kim et al. ............ | 365/185.29 |
| 2011/0258371 A1* | 10/2011 | Yang et al. ............ | 711/103 |

FOREIGN PATENT DOCUMENTS

| | | |
|---|---|---|
| JP | 2008066466 A | 3/2008 |
| JP | 2009016028 A | 1/2009 |
| KR | 1020080035828 A | 4/2008 |
| KR | 1020090000463 A | 1/2009 |

* cited by examiner

*Primary Examiner* — Huan Hoang
*Assistant Examiner* — Jay Radke
(74) *Attorney, Agent, or Firm* — Volentine & Whitt, PLLC

(57) ABSTRACT

A method setting a read voltage to minimize data read errors in a semiconductor memory device including multi-bit memory cells. In the method, a read voltage associated with a minimal number of read data error is set based on a statistic value of a voltage distribution corresponding to each one of a plurality of voltage states.

7 Claims, 8 Drawing Sheets

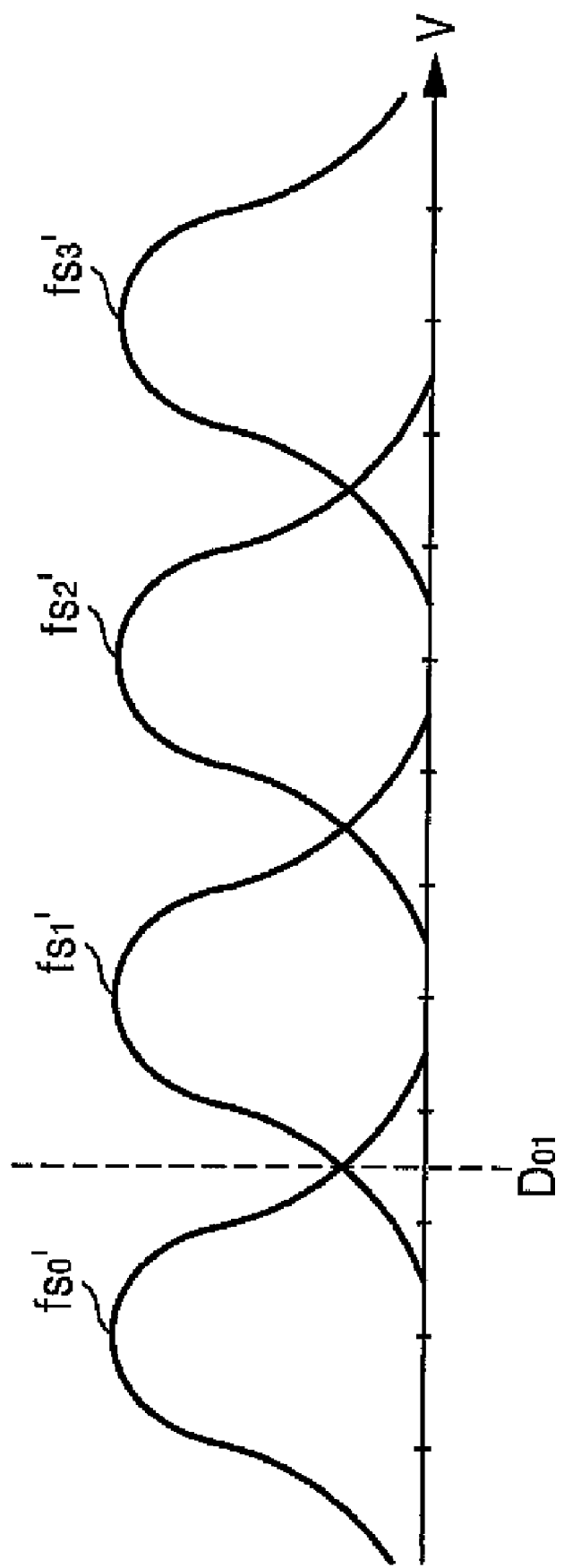

METHOD OF SETTING READ VOLTAGE MINIMIZING READ DATA ERRORS

CROSS-REFERENCE TO RELATED APPLICATIONS

This application claims priority under 35 U.S.C. §119 to Korean Patent Application No. 10-2009-0043825 filed on May 20, 2009, the subject matter of which is hereby incorporated by reference.

BACKGROUND

The present inventive concept relates to methods and related memory devices that reduce the number of read data errors.

Semiconductor memory devices may be categorized as volatile and non-volatile in their operative nature. Volatile memory devices have an advantage in read/write speed, but lose stored data in the absence of applied power. In contrast, non-volatile memory devices retain stored data even in the absence of applied power. Accordingly, non-volatile memory devices are preferably used to store information that should be preserved regardless of power supply.

Examples of non-volatile memory devices are mask read-only memory (ROM), programmable read-only memory (PROM), erasable programmable read-only memory (EPROM), and electrically erasable programmable read-only memory (EEPROM). Especially, flash EEPROM have higher density of integration than normal EEPROM and are thus used as large-capacity auxiliary memory devices.

Flash memory devices can store multi-bit data per cell. To store multi-bit data, a read voltage should be properly set in order to distinguish different voltage states (data states). Various methods of setting the read voltage according to voltage distributions have been introduced and used but do not provide solutions to optimally minimize read data errors.

SUMMARY

Embodiments of the inventive concept provide a method and memory device capable of setting a read voltage to minimize read data errors.

According to some embodiments of the inventive concept, there is provided a method of setting a read voltage. The method includes calculating a read data error probability to based on a variable read voltage level relative to a first voltage distribution corresponding to a first voltage state and to a second voltage distribution corresponding to a second voltage state, and setting the read voltage to an optimal read voltage level to distinguish the first voltage state from the second voltage state, wherein the optimal read voltage level corresponds corresponding to a calculated minimal read data error probability.

The calculating the read data error probability based on the variable read voltage level may further include varying the read voltage level in a range defined between a first voltage limit and a second voltage limit. At this time, the first voltage limit may be a maximum value in the voltage range corresponding to the first voltage distribution, and the second voltage limit may be a minimum value in the voltage range corresponding to the second voltage distribution.

The calculating the read data error probability based on the variable read voltage level may include calculating the read data error probability using an average and a variance for each one of the first and second voltage distributions. The read data error probability may be a calculated bit error rate (BER).

According to other embodiments of the inventive concept, there is provided a method of setting a read voltage. The method includes calculating a first read voltage distinguishing a first voltage state from a second voltage state adjacent to the first voltage state using a first method, calculating a second read voltage for distinguishing the first voltage state from the second voltage state using a second method, and calculating a third read voltage distinguishing the first voltage state from the second voltage state based on the first read voltage and the second read voltage.

The first method may be setting the first read voltage to a read voltage level that corresponds to a valley portion of a sum of a voltage distribution corresponding to the first voltage state and a voltage distribution corresponding to the second voltage state. The second method may be setting the second read voltage to a read voltage level at which a number of data errors occurring with respect to the voltage distribution corresponding to the first voltage state is the same as a number of read data errors occurring with respect to the voltage distribution corresponding to the second voltage state.

The calculating the third read voltage may include calculating the third read voltage by performing an offset compensation on at least one of the first and second read voltages.

The calculating the third read voltage by performing the offset compensation may include at least one of performing offset compensation of the first read voltage such that the first read voltage is shifted toward a voltage state having a smaller variance among the first and second voltage states and performing an offset compensation on the second read voltage such that the second read voltage is shifted toward a voltage state having a greater variance among the first and second voltage states. An offset compensation value used to perform the offset compensation is determined based on the relative difference of the smaller variance and the greater variance.

The calculating the third read voltage may include calculating the third read voltage by taking an average of the first read voltage and the second read voltage. At this time, the average may be an arithmetic mean, a geometric mean, or a harmonic mean.

According to other embodiments of the inventive concept, there is provided a memory device comprising a memory cell array of multi-bit memory cells, a page buffer storing read data, and a read-voltage adjustment block configured to set a read voltage used during a read operation by calculating a read data error probability while varying the level of the read voltage relative to a first voltage distribution corresponding to a first voltage state and a second voltage distribution corresponding to a second voltage state, and setting the read voltage to an optimal read voltage level to distinguish the first voltage state from the second voltage state, wherein the optimal read voltage level corresponds to a calculated minimal read data error probability.

BRIEF DESCRIPTION OF THE DRAWINGS

The above and other features and advantages of the inventive concept will become more apparent by describing in detail exemplary embodiments thereof with reference to the attached drawings in which:

FIGS. 1A and 1B are diagrams showing the voltage states of a multi-level cell (MLC);

DETAILED DESCRIPTION OF THE EMBODIMENTS

Figure 1A:
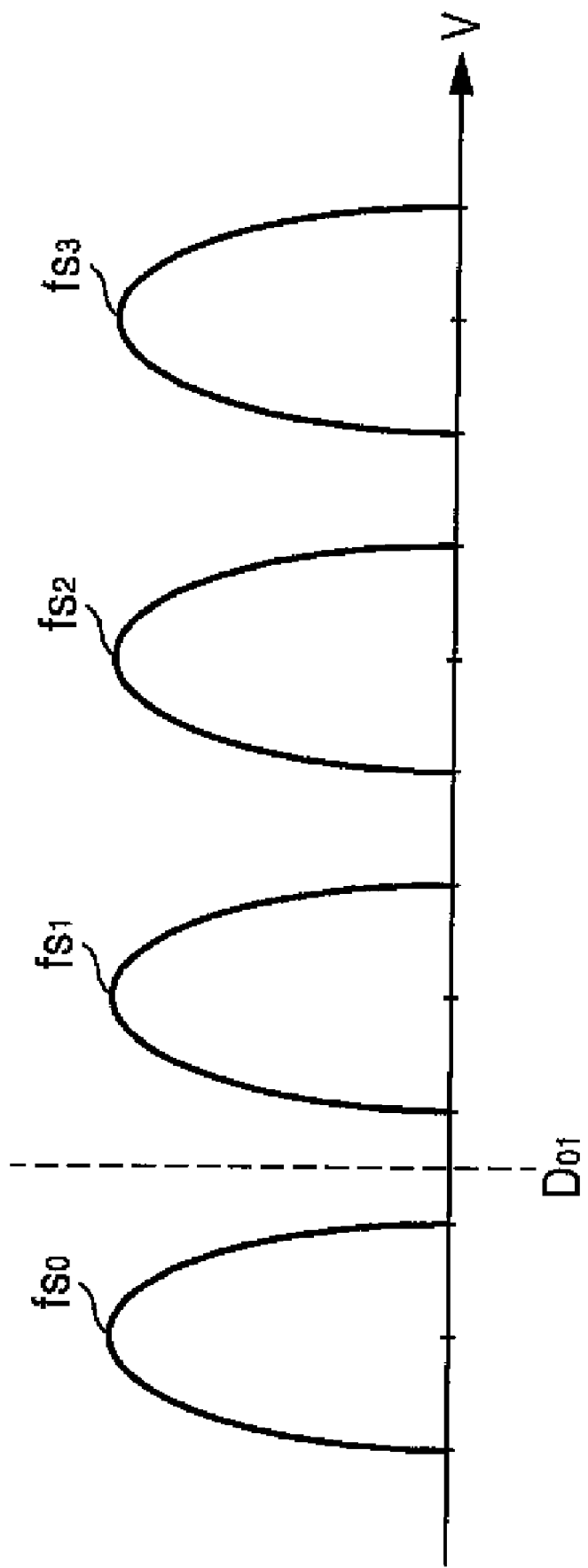

Certain embodiments of the inventive concept now will be described in some additional detail with reference to the accompanying drawings. The inventive concept may, however, be embodied in many different forms and should not be construed as being limited to only the illustrated embodiments. Rather, the embodiments are presented as teaching examples to convey the making and use of the inventive concept to those skilled in the art. Throughout the written description and drawings, like numbers refer to like or similar elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

As is understood by those skilled in the art, multi-bit memory cells in contemporary semiconductor memory devices may be programmed to one of a plurality of logic value states or data states (each logic value or data state being uniquely associated with a voltage distribution for the memory cell) by application of certain program voltage(s) to a corresponding word line. Subsequent to the programming of the multi-bit memory cell, it may be read (or its programmed state discriminated or distinguished) by applying a read voltage having a properly defined level.

There are many different types of program operations that may be applied to one or a plurality of memory cells within a memory array. For instance, an entire row (or part of a row) of memory cells within the memory array may be programmed to the same state by a properly controlled application of programming voltage(s) to a word line corresponding to the row. This type of program operation is referred to as "equalization programming." In certain approaches to equalization programming, a fixed and predetermined number of memory cells (e.g., 16, 64, 256, etc., and hereafter "an equalization programming block") may be subjected to the equalization programming, such that each memory cell in the equalization programming block is programmed to the same state.

During equalization programming, a relatively high program voltage is typically applied to the word line corresponding to the selected row of memory cells. After the equalization programming, a particular type of read operation may be performed which involves selecting (or defining) an optimal read voltage for reading the memory cells of the equalization programming block. This type of read operation will be referred to as a "test read operation". As a result of the test read operation, a voltage ("the least read voltage") to which the least number of memory cells in the equalization programming block is programmed is determined. The determined least read voltage may then be used as the appropriate read voltage during a normal read operation to minimize read data errors. When an optimal read voltage is selected and used in this way, the burden of error detection/correction may be reduced or minimized for the read operation. Hereinafter, a method of setting the least read voltage prior to a read operation performed in a memory device according to embodiments of the inventive concept will be described.

FIGS. 1A and 1B are diagrams respectively showing the voltage distributions or logic states for a multi-level cell (MLC). A 2-bit MLC having $2^2$ voltage states has been assumed for purposes of this explanation, but those skilled in the art will recognize that the inventive concept is not limited to memory arrays including only 2-bit MLCs. FIG. 1A shows an ideal case for voltage states $f_{S0}$, $f_{S1}$, $f_{S2}$, and $f_{S3}$, while FIG. 1B shows a more realistic case for voltage states $f_{S0}'$, $f_{S1}'$, $f_{S2}'$, and $f_{S3}'$.

Referring to FIG. 1A, the 2-bit memory cell may be programmed to any one of the voltage states $f_{S0}$, $f_{S1}$, $f_{S2}$, and $f_{S3}$. In the ideal case, the voltage states $f_{S0}$, $f_{S1}$, $f_{S2}$, and $f_{S3}$ are regularly spaced by a defined read margin separating adjacent voltage states. In addition, each of the ideal voltage states $f_{S0}$, $f_{S1}$, $f_{S2}$, and $f_{S3}$ extends across a predetermined and uniform voltage distribution range. It will be appreciated from this general description that as the total number of voltage states ($2^N$) for an N-bit MLC will increase with "N", thereby resulting in reduced read margin and a narrower voltage distribution range for each voltage state. This is true because there are finite limits to the amount of charge that may be injected to the floating gate of a MLC, thereby limiting a maximum highest logic voltage state for the MLC.

Read errors do not significantly arise so long as the voltage states $f_{S0}$, $f_{S1}$, $f_{S2}$, and $f_{S3}$ remain distinct and well separated as illustrated in FIG. 1A. But this is rarely the case in the real world. Hence, the more realistic voltage states $f_{S0}'$, $f_{S1}'$, $f_{S2}'$, and $f_{S3}'$ of FIG. 1B may be formed due to coupling, charge leakage, and other effects. For instance, when a conventionally understood read circuit in a memory device "sets" a read voltage for use during a read operation to the voltage level $D_{01}$, a read data error will not occur in the ideal case of FIG. 1A where the first voltage state $f_{S0}$ is clearly distinct from the adjacent second voltage state $f_{S1}$ in relation to the read voltage $D_{01}$. However, a read data error will occur in the realistic case of FIG. 1B where the first voltage state $f_{S0}$ is not clearly distinct from the adjacent second voltage state $f_{S1}$ in relation to the read voltage $D_{01}$.

This result illustrates a primary reason why the read margin and voltage range for each voltage state must be reduced as the number of bits ("N") stored in a MLC is increased. This result also illustrates why error detection and/or correction (hereafter, generically "ECC") capabilities are more and more frequently incorporated into memory systems and memory devices. That is, ECC is capable of fixing a certain limited number of read data errors. However, sophisticated ECC capabilities come at some cost (e.g., circuit and operating complexity, processing time, etc.) within a memory system or device. Hence, wherever possible read data errors should be minimized. One way to minimize read data errors is the efficient and appropriate setting of a read voltage to be used during a read operation.

Figure 2:
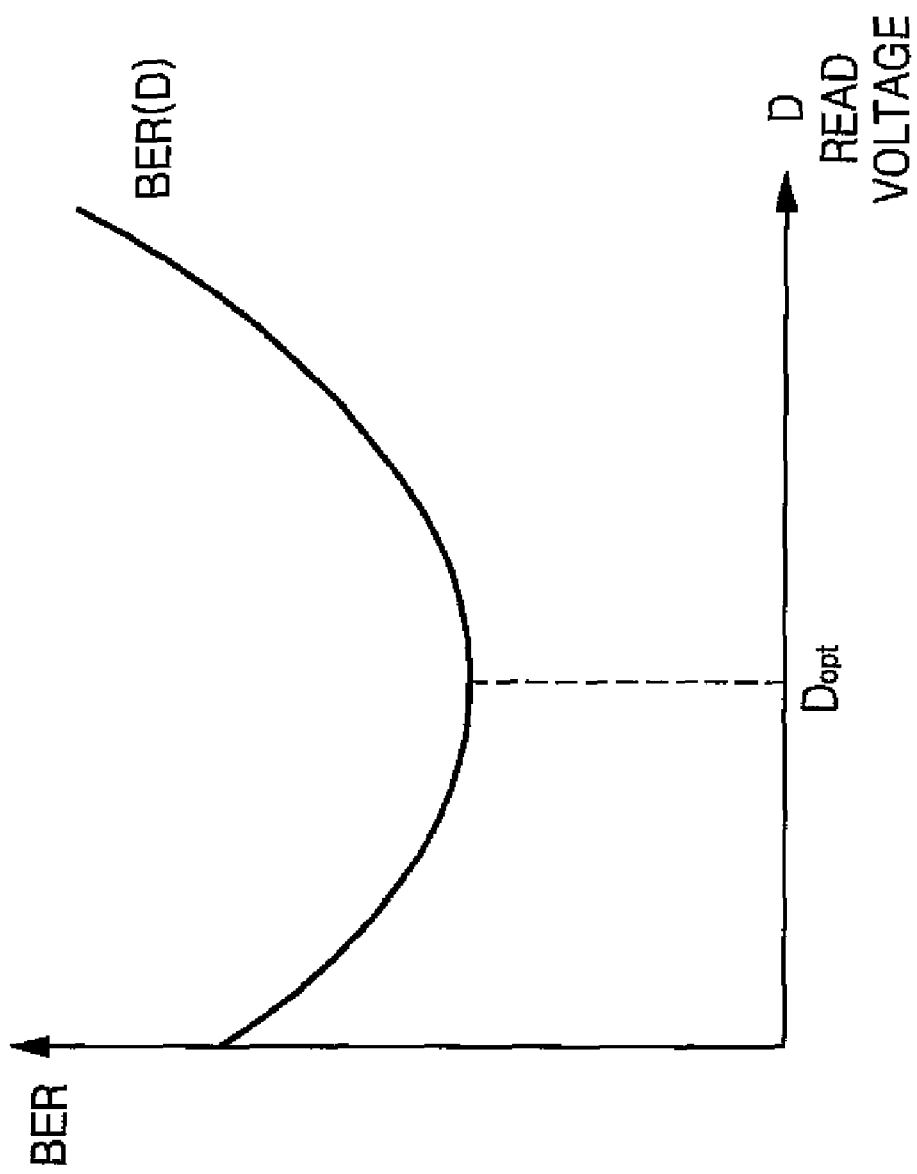
FIG. 2 is a graph for explaining a method of minimizing a read error according to some embodiments of the inventive concept.

FIG. 2 is a graph generally illustrating a method of minimizing read data errors according to certain embodiments of the inventive concept. A bit error rate (BER) is a numerical value indicating how many bit errors occur during normal read operations performed in a selected memory device. A BER may be calculated as a number of errant bits divided by a total number of bits contained in the read data, and may be used as an index indicating the number of errant bits against a quantity of data stored in a memory device. Accordingly, a decreasing BER means that the number of memory cells providing errant data in falling.

In certain embodiments of the inventive concept, a BER may be used as a reference value indicating a frequency of read data errors occurring during read operations performed for a memory device. However, those skilled in the art will recognize that a BER is only one metric that may be used to indicate the frequency of read data errors. Many other values, expression, or formulas indicating the occurrence frequency of read data errors may be used instead of a BER.

In FIG. 2, for example, the BER is shown in relation to the level of a read voltage "D". A minimal BER corresponds to an optimal read voltage selection $D_{opt}$. More particularly, when at least two voltage states, each having a corresponding average and variance (e.g., standard deviation), need to be distinguished from each other $D_{opt}$ may be determined from the averages and variances and BER may be expressed as a function of the read voltage D (or "BER(D)"). In another possible embodiment, the relationship of BER(D) may be expressed by a complementary error function (erfc).

When BER(D) is calculated as the read voltage level D is changed, the graph illustrated in FIG. 2 is obtained. Accordingly, an optimal read voltage $D_{opt}$ minimizing read data errors may be identified by a minimum BER(D). The read voltage level D may be varied across a range between a first voltage limit and a second voltage limit. The first and second voltage limits may be selected according to a number of factors and references. For example, the first voltage limit may be defined as a high limit in the voltage range corresponding to a lower voltage distribution between two adjacent voltage distributions to-be-differentiated by the read voltage. The second voltage limit may be defined as the lower limit in the voltage range corresponding to a higher voltage distribution between the two adjacent voltage distributions. In this manner, for example, the level of the read voltage D may be changed over a range defined by two limits ensuring that the two adjacent voltage states do not overlap each other, as in the ideal case of FIG. 1A.

Figure 3:
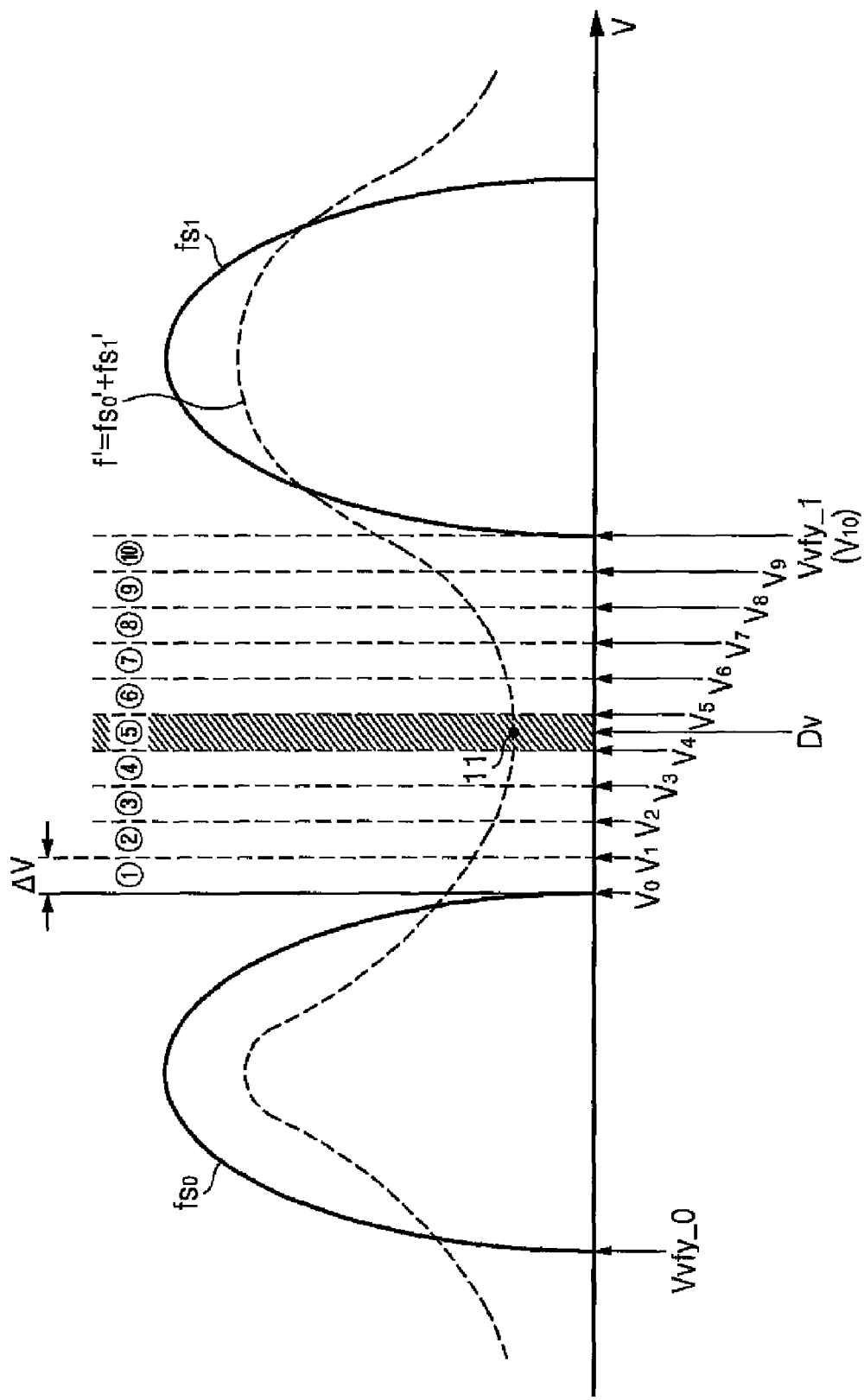
FIG. 3 is a graph for explaining a method of setting a read voltage according to some embodiments of the inventive concept.

FIG. 3 is a graph further explaining a method of setting a read voltage level according to certain embodiments of the inventive concept. FIG. 3 illustrates a method of determining a read voltage capable of faithfully distinguishing two adjacent voltage states $f_{S0}$ and $f_{S1}$. In addition, the method illustrated in FIG. 3 is a method capable of detecting a "valley portion" 11 of the two (potentially overlapping) voltage distributions. Accordingly, the illustrated embodiment is one possible approach to implementing a so-called "valley algorithm". Referring to FIG. 3, the voltage states $f_{S0}$ and $f_{S1}$ shown by solid lines represent ideal threshold voltage distributions. The dashed line denotes a non-ideal voltage distribution in which the adjacent voltage states overlap. Such a circumstance may be due to memory cell cross-coupling or charge leakage. The non-ideal distribution is labeled $f'=f_{S0}'$ and $f_{S1}'$ because includes, in effect, the combination of actual (non-ideal) voltage states $f_{S0}'$ and $f_{S1}'$.

The first voltage state $f_{S0}'$ and second voltage state $f_{S1}'$ significantly overlap each other due to expansion(s) of the respective voltage distributions. A local minimum point 11 occurring in the valley portion of the overlapping voltage states is shown in region ⑤ of the voltage range. In a method of setting a read voltage according to an embodiment of the inventive concept, a test read operation may be performed to determine a read voltage level $D_V$ corresponding to the local minimum point 11. Therefore, to determine the read voltage level $D_V$ corresponding to the local minimum point 11, different test read voltages $V_0$ through $V_{10}$ may be applied to a selected word line during the test read operation and then a number of memory cells programmed to each one of the plurality of test read voltage ranges ① through ⑩, as defined by each test read voltage $V_0$ through $V_{10}$ is counted. In this approach a particular voltage range (e.g., ⑤ in FIG. 3) in the plurality of voltage ranges will exhibit a minimum number of counted memory cells. Hence, the test read voltage of $D_V$, which is the voltage level that identifies the valley portion of the overlapping adjacent voltage distributions, corresponding to this particular voltage range may be determined to be the optimal read voltage.

FIG. 3 illustrates a test read operation for determining a read voltage for distinguishing the first voltage state $f_{S0}'$ from the second voltage state $f_{S1}'$. The test read operation includes counting a number of memory cells associated with each one of the plurality of voltage ranges ① through ⑩. The test read operation may start from counting the number of memory cells in the voltage range ①, which may commence with application of the test read voltage $V_0$ to a selected word line.

The first test read voltage $V_0$ may be the upper limit of a voltage range corresponding to the first voltage state $f_{S0}$ defined in the specification of a memory device. The test read voltage $V_{10}$ corresponding to the upper limit ⑩ of a voltage range with respect to the test read operation is performed may be a verification voltage Vvfy_1 corresponding to the second voltage state $f_{S1}$.

Figure 6:
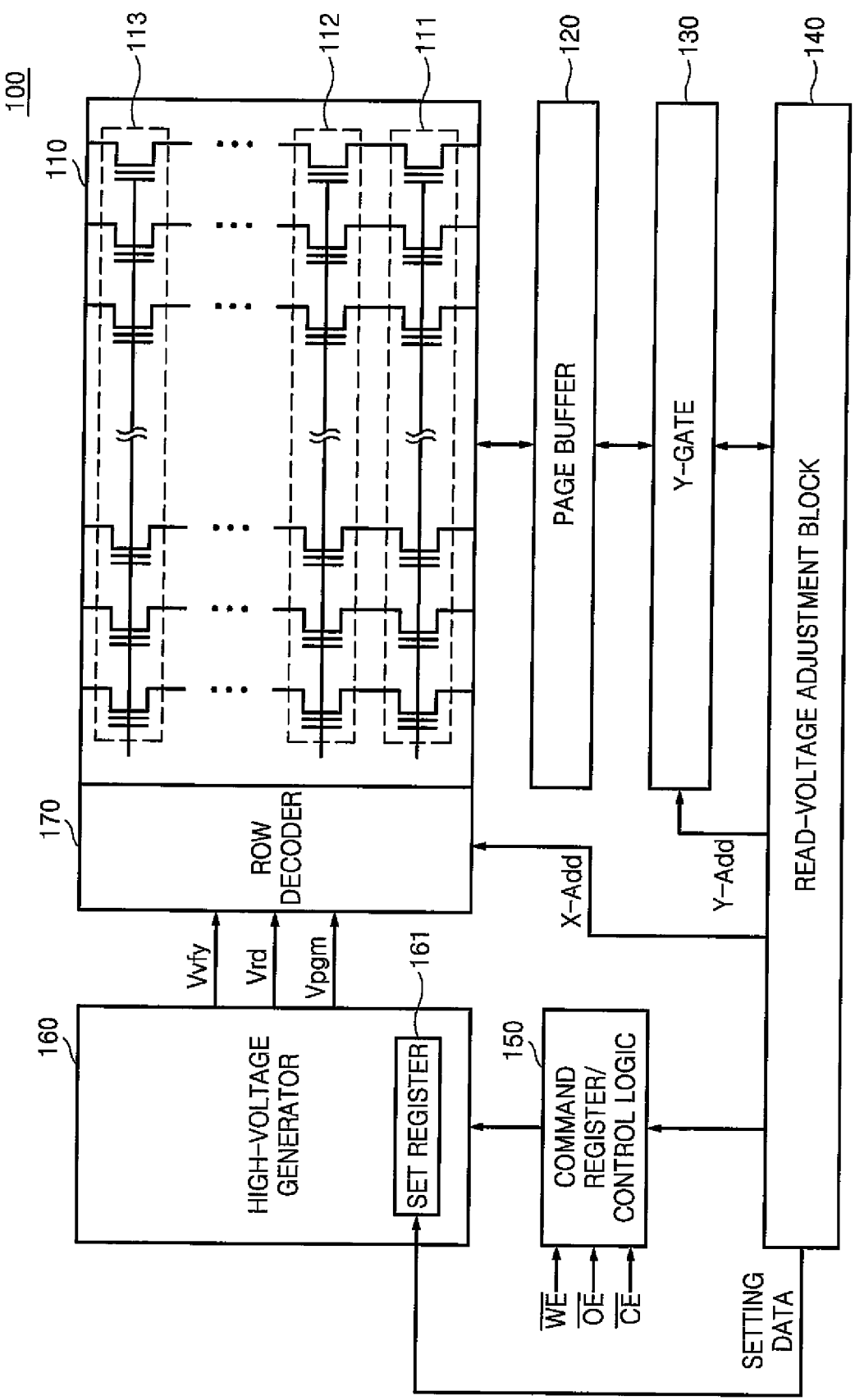
FIG. 6 is a schematic block diagram of a memory device capable of performing a read operation using a method of setting a read voltage according to some embodiments of the inventive concept.

While the test read voltage $V_0$ is being applied to a selected word line, a page buffer (120 in FIG. 6) may sense and latch the "test read data" for memory cells connected to the selected word line. The latched data may be output to a read-voltage adjustment block (140 in FIG. 6), which may store the data read with the test read voltage $V_0$. Similarly, the test read voltage $V_1$ may be applied to the selected word line, the page buffer may sense and latch the data of memory cells, and the latched data may be stored in the read-voltage adjustment block 140 (FIG. 6).

The read-voltage adjustment block may then compare the test read data associated with the test read voltage $V_0$ with the test read data associated with the test read voltage $V_1$ and detect (or calculate) a number of bits that have changed from ON/OFF. By counting these changing bits, the number of memory cells corresponding to the voltage range ① can be calculated. The comparison may be carried out by performing an XOR operation on the two sets of test read data.

In the same manner, the number of memory cells corresponding to each of the other voltage ranges ② through ⑩ can be counted through a similar test read operation. At this time, the read-voltage adjustment block may control a command register (150 in FIG. 6) to generate the test read voltages $V_1$ through $V_{10}$ that increase by a predetermined interval $\Delta V$.

Once finished counting the number of memory cells associated with each respective voltage range ① through ⑩, the read-voltage adjustment block may then select the optimal read voltage $D_V$ for the voltage range (e.g., ⑤ in FIG. 3) having a minimum number of memory cells. For instance, the read-voltage adjustment block may select any reasonable voltage in the identified voltage range ⑤, (i.e., either $V_4$ or $V_5$, a voltage midway between $V_4$ or $V_5$, etc. When the interval $\Delta V$ between incrementally adjacent test read voltages decreases, that is, when the resolution of the test read operation increases, the accuracy of the optimal read voltage $D_V$ increases.

Figure 4:
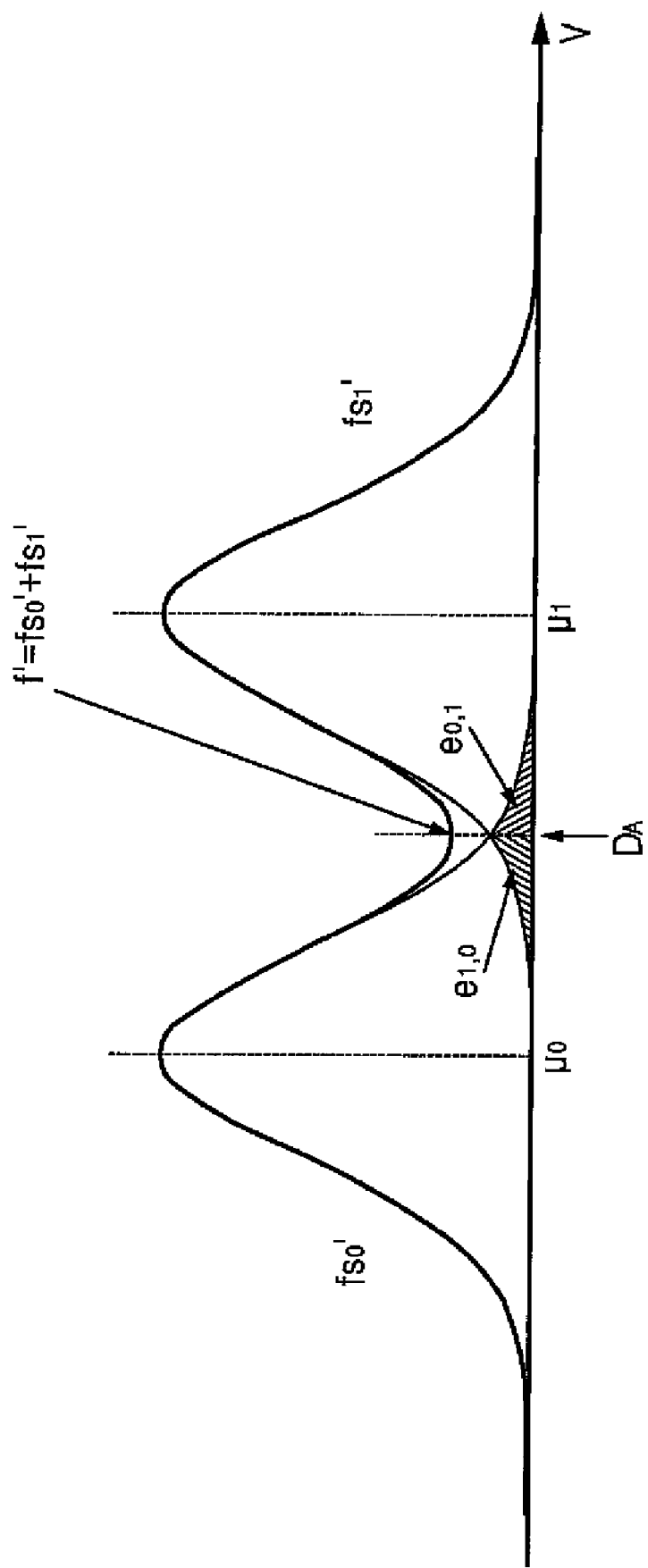
FIG. 4 is a graph for explaining a method of setting a read voltage according to other embodiments of the inventive concept.

FIG. 4 is a graph explaining a method of setting a read voltage according to another embodiment of the inventive concept. In the method illustrated in FIG. 4, a read voltage $D_A$ yielding the same read data error probability occurrence with respect to each of two voltage states $f_{S0}'$ and $f_{S1}'$ is determined. In other words, when the two voltage states $f_{S0}'$ and $f_{S1}'$ are determined on the basis of the read voltage $D_A$, a probability $e_{1,0}$ of incorrectly determining the second voltage state $f_{S1}'$ as the first voltage state $f_{S0}'$ is the same as a probability $e_{0,1}$ of incorrectly determining the first voltage state $f_{S0}'$ as the second voltage state $f_{S1}'$.

The method illustrated in FIG. 4 will be referred to as an "Agrawal algorithm", hereinafter. A read voltage obtained using the Agrawal algorithm will be represented by "$D_A$". When a read operation is performed using an Agrawal-algorithm-defined, optimal read voltage $D_A$, the probability of read data error occurrence is the same, as between two adjacent voltage states $f_{S0}'$ and $f_{S1}'$. Accordingly, the optimal read voltage $D_A$ may be selected as a read voltage best distinguishing the two adjacent voltage states $f_{S0}'$ and $f_{S1}'$.

Figure 5:
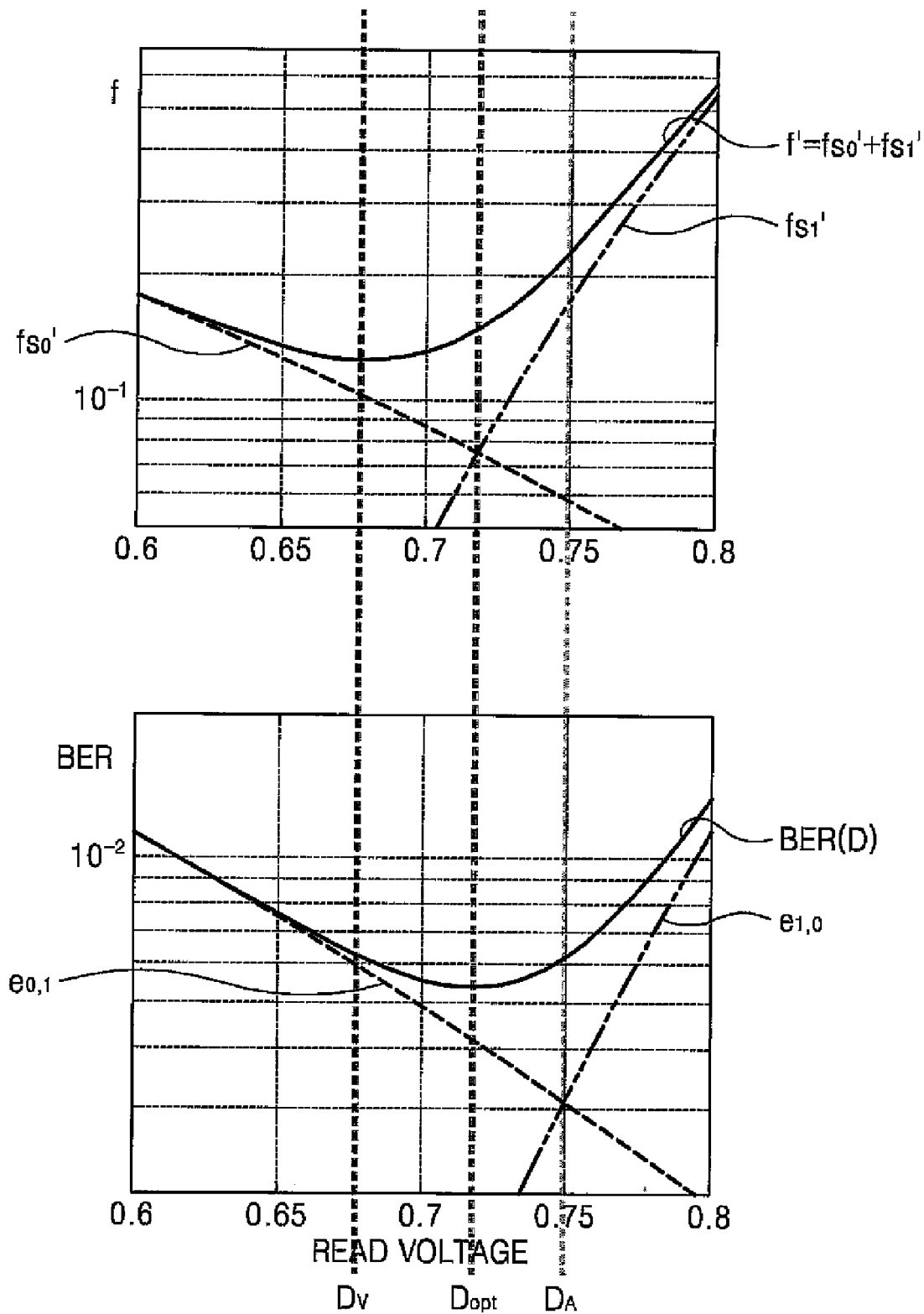
FIG. 5 is a diagram showing the comparison of the methods illustrated in FIGS. 2 through 4.

FIG. 5 is a diagram showing the comparison of the methods illustrated in FIGS. 2 through 4. FIG. 5 is provided to compare values obtained by these different methods and used to set an optimal read voltage. Referring to FIG. 5, the first actual voltage state $f_{S0}'$ and the second actual voltage state $f_{S1}'$ have a Gaussian distribution and the standard deviation of the first voltage state $f_{S0}'$ is greater than that of the second voltage state $f_{S1}'$.

When the valley algorithm illustrated in FIG. 3 is used, the local minimum point of the voltage distribution is the read voltage $D_V$ minimizing an error. In particular, at the top portion of FIG. 5, $f' = f_{S0}' + f_{S1}'$ denotes the calculated voltage distribution using the valley algorithm assuming the illustrated first actual voltage state $f_{S0}'$ and the second actual voltage state $f_{S1}'$. When the Agrawal algorithm illustrated in FIG. 4 is used, a voltage at which the probability $e_{1,0}$ is the same as the probability $e_{0,1}$ is the read voltage $D_A$. According to the method illustrated in FIG. 2, the read voltage $D_{opt}$ at which BER(D) is minimum can be determined as represented at the bottom portion of FIG. 5.

As is seen from FIG. 5, a BER cannot be minimized with the read voltage $D_V$ obtained from the valley algorithm or the read voltage $D_A$ obtained from the Agrawal algorithm. Accordingly, an optimal read voltage may be calculated by performing offset compensation of the read voltage $D_V$ or $D_A$. For instance, when offset compensation of $D_V$ obtained from the valley algorithm is performed such that $D_V$ is shifted toward the voltage state having the smaller standard deviation (i.e., to the right side in FIG. 5), a read voltage close to $D_{opt}$ is determined. Similarly, when offset compensation of $D_A$ obtained from the Agrawal algorithm is performed such that $D_A$ is shifted toward the voltage state having the greater standard deviation (i.e., to the left side in FIG. 5), a read voltage close to $D_{opt}$ is determined. At this time, when a difference in standard deviation between the voltage states $f_{S0}'$ and $f_{S1}'$ increases, the BER can be efficiently improved. Accordingly, when a method of setting a read voltage according to some embodiments of the present inventive concept is used, the BER is more effectively improved in memory devices having the greater difference in standard deviation between voltage states.

An offset compensation value used to shift the read voltage $D_V$ or $D_A$ closer to the read voltage $D_{opt}$ may be determined based on the mean and the variance (or the standard deviation) of a voltage distribution. The offset compensation value may be stored in a table and, afterward, it may be referred to when similar offset compensation is performed.

The read voltage $D_{opt}$ exists between the read voltage $D_V$ and the read voltage $D_A$, as shown in FIG. 5, and therefore, the read voltage $D_{opt}$ may be determined by taking an average of $D_V$ and $D_A$. At this time, the average may be the arithmetic mean, the geometric mean, or the harmonic mean. Alternatively, a random value between $D_V$ and $D_A$ may be determined as the read voltage $D_{opt}$.

When two voltage states have the Gaussian distribution and have the same variance or standard deviation, the read voltages $D_{opt}$, $D_V$, and $D_A$ are all the same and may correspond to the mean of the means of the two voltage states, which may be expressed by Equation:

$$\text{if } \sigma 0 = \sigma 1, \text{ then } D_{opt} = D_V = D_A = (\mu 0 + \mu 1)/2,$$

where $\sigma 0$ is the variance or standard deviation of a first voltage state, $\sigma 1$ is the variance or standard deviation of a second voltage state, $\mu 0$ is the mean of the first voltage state, and the $\mu 1$ is the mean of the second voltage state. Accordingly, BER($D_{opt}$), BER($D_V$), and BER($D_A$) are all the same.

FIG. 6 is a schematic block diagram of a memory device 100 capable of performing a read operation using the above-described methods of setting a read voltage according to certain embodiments of the inventive concept. Referring to FIG. 6, the read-voltage adjustment block 140 controls other elements such that equalization programming is performed for memory cells connected to a selected word line, or a test read operation is performed on programmed memory cells. Based on a result of the test read operation, the read-voltage adjustment block 140 determines a read voltage having a minimum read error as an optimal read voltage.

In the operation of the memory device 100, a cell array 110 includes memory cells connected to bit lines and word lines. Memory cells sharing a word line may have a voltage distribution extending upward or downward due to coupling occurring during a program operation. When the memory device 100 is a multi-bit memory device, the cell array 110 stores N-bit data where N is a natural number and N≧2.

The cell array 110 is divided into word line units 111, 112, and 113. Page data programmed at one time in the program operation is written to memory cells with a program voltage applied to a single word line. In a read operation, the page data stored in the memory cells connected to the word line is sensed and latched by the page buffer 120 while a read voltage is being applied to the word line. In other words, an optimal read voltage may be selected for each of the word lines and each word line may be divided into an even-numbered page and an odd-numbered page, and therefore, a read voltage may be separately applied to each of the even-numbered and odd-numbered pages.

The page buffer 120 operates as a write driver or a sense amplifier according to an operation mode. In the program operation, the page buffer 120 loads page data to be programmed to the cell array 110 and the loaded page data is transferred to bit lines and programmed to memory cells. In the read operation, the page buffer 120 senses data from memory cells in the cell array 110 and stores the sensed data.

In the read operation, a Y-gate 130 transmits data latched at the page buffer 120 to an input/output buffer (not shown) in response to column addresses Y-Add. In the program operation, the Y-gate 130 transmits input data to the page buffer 120. In the test read operation, the Y-gate 130 transmits data read from memory cells selected in response to the column addresses Y-Add from the page buffer 120 to the read-voltage adjustment block 140. Moreover, in the equalization programming, the Y-gate 130 transmits test data output from the read-voltage adjustment block 140 to the page buffer 120.

The read-voltage adjustment block 140 sets an optimal read voltage for memory cells corresponding to a word line or a page unit included in the cell array 110. During a test process, the read-voltage adjustment block 140 controls a command register/control logic 150 to program test data. Through the equalization programming, each memory cell will have one distinct voltage state among a plurality of possible voltage states.

After the equalization programming, the read-voltage adjustment block 140 performs the test read operation to select an optimal read voltage for a selected word line. The read-voltage adjustment block 140 selects an optimal read voltage between two adjacent voltage states for the selected word line through the test read operation. The selected optimal read voltage is provided as information for adjusting a voltage level of a high-voltage generator 160. The read-voltage adjustment block 140 selects an optimal read voltage for each word line or each page of the word line.

The command register/control logic 150 controls the high-voltage generator 160 according to a flag signal from the read-voltage adjustment block 140. The command register/control logic 150 controls the voltage generation of the high-voltage generator 160 for a program operation, a read operation, or an equalization operation (such as an erase operation) in response to an external control signal /WE, /OE, or /CE or an external command. Especially, the command register/control logic 150 controls the high-voltage generator 160 to continuously output high-resolution read voltages in response to a control signal from the read-voltage adjustment block 140 during the test read operation.

The high-voltage generator 160 generates a word line voltage provided to the cell array 110. The high-voltage generator 160 generates different word line voltages according to operation modes and provides the word line voltages to selected word lines. In the program operation, the high-voltage generator 160 generates a program voltage Vpgm and provides it to a selected word line. In the read operation, the high-voltage generator 160 provides a read voltage Vrd for reading selected page data to a selected word line. The high-voltage generator 160 provides an optimal read voltage for each word line or for each page of multi-bit data on the word line.

To provide an optimal read voltage for each word line or each page of the word line to the cell array 110, the high-voltage generator 160 includes a set register 161. The set register 161 may store setting data for generating optimal read voltages for each word line or setting data for generating optimal read voltages for each page of the word line. The setting data may be generated by the read-voltage adjustment block 140 and obtained from the result of the test read operation.

During the test read operation, the high-voltage generator 160 may sequentially provide high-resolution read voltages to a selected word line. A row decoder 170 selects a word line in response to row addresses X-Add. In addition, the row decoder 170 transmits a word line voltage generated by the high-voltage generator 160 to the selected word line.

Figure 7:
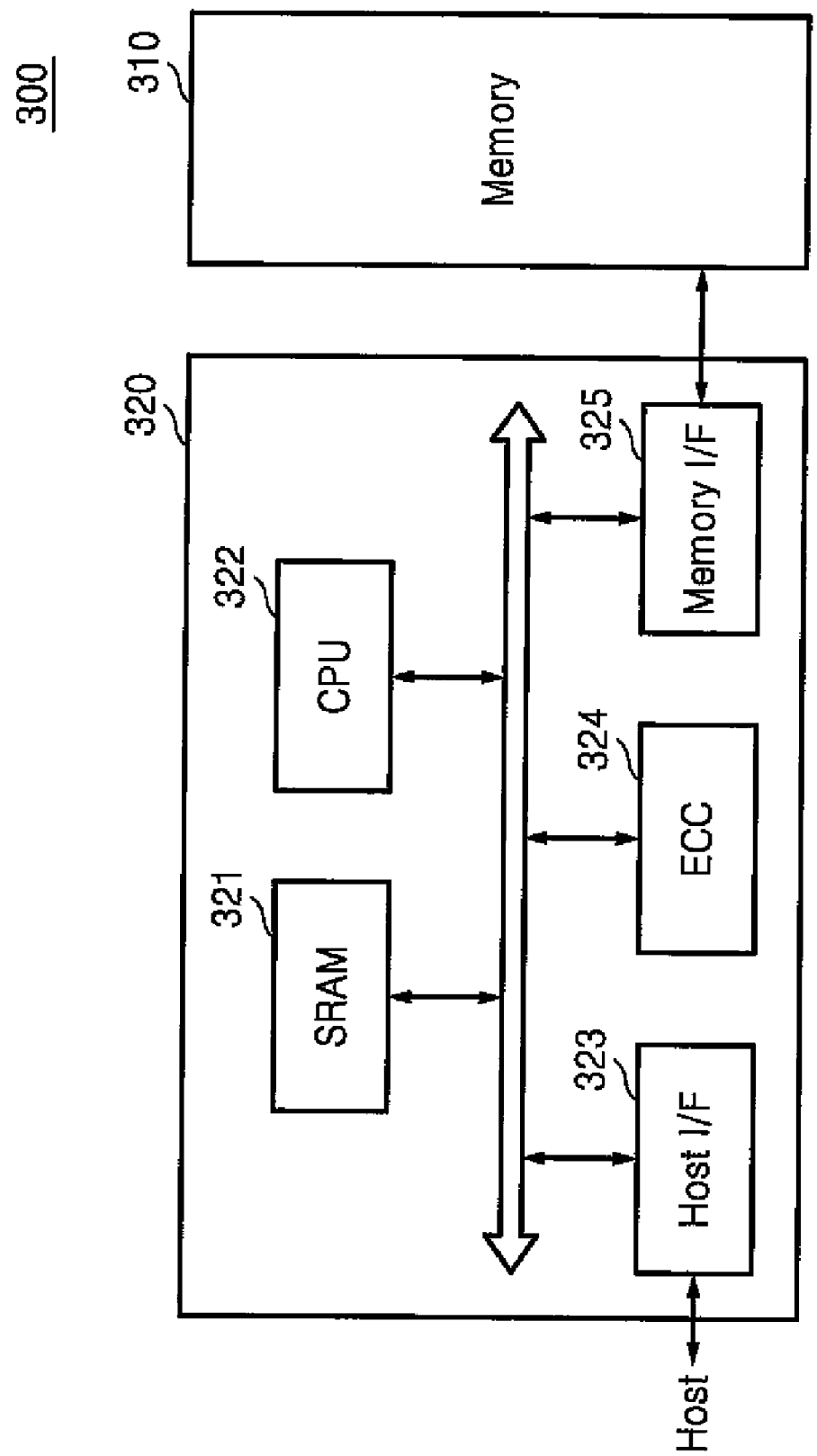
FIG. 7 is a schematic block diagram of a memory system including a memory device according to some embodiments of the inventive concept.

FIG. 7 is a schematic block diagram of a computational system 300 including a memory device 310 according to an embodiment of the inventive concept. The system 300 may be a memory card or a solid state disk (SSD). Referring to FIG. 7, the system 300 supports a large data storage capacity and includes the memory device 310 according to some embodiments of the present inventive concept. The memory device 310 generates an optimal read voltage for a word line or a page in the word line to perform a read operation.

The memory system 300 includes a memory controller 320 which controls data communication between a host and the memory device 310. Read data with an error rate reduced by adjusting a read voltage can be output from the memory device 310, and therefore, the memory system 300 with high reliability can be provided.

A static random access memory (SRAM) 321 is used as an operating memory of a processing unit 322. A host interface (I/F) 323 includes a data exchange protocol of the host connected to the memory system 300. An error correction code (ECC) block 324 detects and corrects an error in data read from the memory device 310. A memory I/F 325 interfaces the memory controller 320 with the memory device 310. The processing unit 322 controls the operation of the memory controller 320 for data communication.

According to the system 300 illustrated in FIG. 7, read data having minimal read data errors may be provided by the memory device 310 and this minimal number of read data errors may be conventionally detected and/or corrected by the ECC block 324. Since the number of read data errors is reduced or minimized by the memory device 310, the burden on the ECC block 324 is also reduced or minimized. When the system 300 is implemented as an SSD, burden on the ECC block 324 is remarkably reduced. The system 300 may be combined with an application chipset, a camera image processor, a mobile dynamic random access memory (DRAM), or the like to be provided as a storage device of an information processing apparatus which communicate a large amount of data.

The inventive concept may be fully or partially embodied in computer code stored on a computer readable recording medium. The computer readable recording medium may be any data storage device capable of storing data read by a computer or digital processor. The computer readable recording medium may be distributed over a network of coupled computer systems so that the computer readable code is stored and executed in a distributed fashion. Also, functional programs, codes, and code segments for accomplishing the present inventive concept can be easily construed by programmers skilled in the art to which the present inventive concept pertains.

As described above, according to embodiments of the inventive concept, the probability of read data errors being provided by a memory device may be dramatically reduced or minimized. While the inventive concept has been particularly shown and described with reference to exemplary embodiments thereof, it will be understood by those of ordinary skill in the art that various changes in forms and details may be made therein without departing from the scope of the inventive concept as defined by the following claims.

What is claimed is:

1. A method of setting a read voltage within a memory device, the memory device configured to apply the read voltage to memory cells during a read operation of the memory device, the method comprising:
    calculating a first read voltage distinguishing a first voltage state from a second voltage state adjacent to the first voltage state using a first method;
    calculating a second read voltage distinguishing the first voltage state from the second voltage state using a second method;
    calculating a third read voltage distinguishing the first voltage state from the second voltage state based on the first read voltage and the second read voltage; and
    configuring the memory device to set the read voltage of the memory device as the third read voltage.

2. The method of claim 1, wherein the calculating the third read voltage comprises calculating the third read voltage by performing an offset compensation on at least one of the first and second read voltages.

3. The method of claim 1, wherein
    the first method comprises:
        setting the first read voltage to a read voltage level that corresponds to a valley portion of a sum of a voltage distribution corresponding to the first voltage state and a voltage distribution corresponding to the second voltage state; and
    the second method comprises:
        setting the second read voltage to a read voltage level at which a number of data read errors occurring with respect to the voltage distribution corresponding to the first voltage state is the same as a number of read data errors occurring with respect to the voltage distribution corresponding to the second voltage state.

4. The method of claim 3, wherein the calculating the third read voltage comprises calculating the third read voltage by performing an offset compensation on at least one of the first and second read voltages.

5. The method of claim 2, wherein the calculating the third read voltage by performing the offset compensation comprises at least one of:
    performing an offset compensation on the first read voltage, such that the first read voltage is shifted toward a voltage state having a smaller variance between the first and second voltage states; and
    performing an offset compensation on the second read voltage, such that the second read voltage is shifted toward a voltage state having a greater variance between the first and second voltage states.

6. The method of claim 5, wherein an offset compensation value used to perform the offset compensation is determined based on the relative difference of the smaller variance and the greater variance.

7. The method of claim 1, wherein the calculating the third read voltage comprises:
    calculating the third read voltage by taking an average of the first read voltage and the second read voltage, wherein the average is one selected from a group consisting of an arithmetic mean, a geometric mean, and a harmonic mean.

* * * * *